(12) United States Patent
Kang et al.

(10) Patent No.: US 12,027,575 B2
(45) Date of Patent: Jul. 2, 2024

(54) METHOD FOR FABRICATING SEMICONDUCTOR STRUCTURE

(71) Applicant: NANYA TECHNOLOGY CORPORATION, New Taipei (TW)

(72) Inventors: Ting-Cih Kang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/333,507

(22) Filed: Jun. 12, 2023

(65) Prior Publication Data
US 2023/0326956 A1 Oct. 12, 2023

Related U.S. Application Data

(62) Division of application No. 16/997,954, filed on Aug. 20, 2020, now Pat. No. 11,756,988.

(51) Int. Cl.
*H01L 23/52* (2006.01)
*H01G 4/30* (2006.01)
*H01L 23/522* (2006.01)
*H01L 49/02* (2006.01)

(52) U.S. Cl.
CPC ............... *H01L 28/60* (2013.01); *H01G 4/30* (2013.01); *H01L 23/5223* (2013.01)

(58) Field of Classification Search
CPC ........ H01L 28/60; H01L 23/5223; H01G 4/30
See application file for complete search history.

(56) References Cited

U.S. PATENT DOCUMENTS

| 10,529,797 | B2 | 1/2020 | Kang et al. | |
|---|---|---|---|---|
| 2006/0208298 | A1* | 9/2006 | Chang | H01L 29/945 257/E27.084 |
| 2009/0057828 | A1 | 3/2009 | Kang | |
| 2010/0019301 | A1* | 1/2010 | Huang | H10B 12/0385 257/E27.092 |
| 2010/0052099 | A1* | 3/2010 | Chang | H01L 23/642 257/E29.342 |
| 2011/0108988 | A1 | 5/2011 | Lim et al. | |
| 2016/0020267 | A1* | 1/2016 | Lin | H01L 29/945 257/532 |
| 2016/0087028 | A1 | 3/2016 | Hirota et al. | |

(Continued)

FOREIGN PATENT DOCUMENTS

TW    I515889 B    1/2016

*Primary Examiner* — Ali Naraghi
*Assistant Examiner* — Siangluai Mang
(74) *Attorney, Agent, or Firm* — CKC & Partners Co., LLC

(57) ABSTRACT

A semiconductor structure includes a trench capacitor, a stacked capacitor, a first electrode plate, and a second electrode plate. The trench capacitor is located in a substrate, in which the trench capacitor has a first conductive structure and a first dielectric structure in contact with the first conductive structure. The stacked capacitor has a second conductive structure and a second dielectric structure in contact with the second conductive structure, in which the stacked capacitor is at least partially aligned with the trench capacitor in an axis vertical to a top surface of the substrate, and the first and second conductive structures are electrically connected. The trench capacitor and the stacked capacitor are electrically connected in parallel between the first and second electrode plates.

15 Claims, 7 Drawing Sheets

(56) References Cited

U.S. PATENT DOCUMENTS

| | | | |
|---|---|---|---|
| 2016/0218071 A1* | 7/2016 | Nam | G06F 21/86 |
| 2020/0066922 A1* | 2/2020 | Cheng | H01L 27/016 |
| 2020/0176552 A1 | 6/2020 | Chang et al. | |
| 2021/0057329 A1* | 2/2021 | Marzaki | H01L 28/92 |
| 2021/0391314 A1* | 12/2021 | Jeng | H01L 21/565 |

* cited by examiner

100

```
┌─────────────────────────────────────────────────────┐
│ forming a trench capacitor in a substrate, and the  │
│ trench capacitor has a first conductive structure   │──── 101
│ and a first dielectric structure in contact with    │
│ the first conductive structure                      │
└─────────────────────────────────────────────────────┘
                          │
                          ▼
┌─────────────────────────────────────────────────────┐
│ forming a stacked capacitor which has a second      │
│ conductive structure and a second dielectric        │
│ structure in contact with the second conductive     │──── 103
│ structure, and the stacked capacitor is at least    │
│ partially aligned with the trench capacitor in an   │
│ axis vertical to a top surface of the substrate     │
└─────────────────────────────────────────────────────┘
                          │
                          ▼
┌─────────────────────────────────────────────────────┐
│ forming a first electrode plate which is            │
│ electrically connected to the first and second      │──── 105
│ dielectric structures                               │
└─────────────────────────────────────────────────────┘
                          │
                          ▼
┌─────────────────────────────────────────────────────┐
│ forming a second electrode plate electrically       │
│ connected to the first and second conductive        │──── 107
│ structures                                          │
└─────────────────────────────────────────────────────┘
```

Fig. 1

METHOD FOR FABRICATING SEMICONDUCTOR STRUCTURE

CROSS-REFERENCE TO RELATED APPLICATION

This application is a Divisional application of the U.S. application Ser. No. 16/997,954, filed on Aug. 20, 2020, the entirety of which is incorporated by reference herein in their entireties.

BACKGROUND

Field of Invention

The present invention relates to a method for fabricating a semiconductor structure.

Description of Related Art

A decoupling capacitor is a capacitor used to decouple one part of an electrical network (circuit) from another. Noise caused by other circuit elements is shunted through the capacitor, reducing the effect it has on the rest of the circuit.

As the recent tendency, capacitance and size of the decoupling capacitor has become critical in order to support multifunction of electrical devices. If the capacitance is not high enough, some functions of electrical devices may not operate well or even stop.

Therefore, there is a need to develop a method for miniaturizing decoupling capacitor and increasing capacitance thereof to solve the above mentioned problems.

SUMMARY

The present disclosure provides a semiconductor structure including a trench capacitor, a stacked capacitor, a first electrode plate, and a second electrode plate. The trench capacitor is located in a substrate, in which the trench capacitor has a first conductive structure and a first dielectric structure in contact with the first conductive structure. The stacked capacitor has a second conductive structure and a second dielectric structure in contact with the second conductive structure, in which the stacked capacitor is at least partially aligned with the trench capacitor in an axis vertical to a top surface of the substrate, and the first and second conductive structures are electrically connected. The first electrode plate is electrically connected to the first and second dielectric structures. The second electrode plate is electrically connected to the first and second conductive structures, such that the trench capacitor and the stacked capacitor are electrically connected in parallel between the first and second electrode plates.

In some embodiments of the present disclosure, the first conductive structure has a top surface level with a top surface of the first dielectric structure.

In some embodiments of the present disclosure, the first dielectric structure has a portion surrounded by the first conductive structure in the substrate.

In some embodiments of the present disclosure, the first dielectric structure has another portion extending above the substrate.

In some embodiments of the present disclosure, the second conductive structure is cup-shaped.

In some embodiments of the present disclosure, the second conductive structure surrounds a portion of the second dielectric structure.

In some embodiments of the present disclosure, the semiconductor structure further includes a via and a third electrode plate. The via extending through the substrate, wherein the via is in contact with the first conductive structure. The third electrode plate is under the substrate, and the third electrode plate is in contact with the via.

In some embodiments of the present disclosure, the substrate has a thickness equal to or smaller than 6 um.

In some embodiments of the present disclosure, the second electrode plate is aligned with the third electrode plate along with the axis.

Another aspect about the present invention is related to a method for fabricating a semiconductor structure. The method includes: forming a trench capacitor in a substrate, in which the trench capacitor has a first conductive structure and a first dielectric structure in contact with the first conductive structure; forming a stacked capacitor having a second conductive structure and a second dielectric structure in contact with the second conductive structure, in which the stacked capacitor is at least partially aligned with the trench capacitor in an axis vertical to a top surface of the substrate, the first and second conductive structures are electrically connected; forming a first electrode plate electrically connected to the first and second dielectric structures; and forming a second electrode plate electrically connected to the first and second conductive structures, such that the trench capacitor and the stacked capacitor are electrically connected in parallel between the first and second electrode plates.

In some embodiments of the present disclosure, forming a trench capacitor in a substrate includes: forming a first recess in the substrate; forming a first conductive layer over the first recess and the substrate; and partially removing the first conductive layer, such that the first conductive structure is formed; and forming the first dielectric structure over the first conductive structure.

In some embodiments of the present disclosure, the first conductive structure has a portion surrounding a portion of the first dielectric structure in the substrate.

In some embodiments of the present disclosure, the first dielectric structure has a top surface level with a top surface with the first conductive structure.

In some embodiments of the present disclosure, forming the stacked capacitor includes: forming a first inter-metal dielectric layer on the trench capacitor; forming a first metal structure extending through the first inter-metal dielectric layer, in which the first conductive structures is in contact with the first metal structure; forming a second inter-metal dielectric layer on the first inter-metal dielectric layer; forming a second recess aligned with the first recess in the second inter-metal dielectric layer, and the second recess exposes a portion of the first metal structure; forming the second conductive structure over the second recess, in which the second conductive structure is in contact with the first metal structure; and forming the second dielectric structure over the second conductive structure.

In some embodiments of the present disclosure, the second conductive structure has a top surface level with a top surface of the second inter-metal dielectric layer.

In some embodiments of the present disclosure, the second conductive structure is cup-shaped.

In some embodiments of the present disclosure, forming the first electrode plate includes: forming an inter-metal dielectric layer between the first electrode plate and the substrate; and forming a second metal structure and a third metal structure in the inter-metal dielectric layer, in which the second metal structure is in contact with the first electrode plate and the second dielectric structure, and the third metal structure is in contact with the first electrode plate and the first dielectric structure.

In some embodiments of the present disclosure, forming the second electrode plate includes: forming an inter-metal dielectric layer between the second electrode plate and the substrate; and forming a forth metal structure in the inter-metal dielectric layer, in which the forth metal structure is in contact with the second electrode plate and the first metal structure.

In some embodiments of the present disclosure, the method further includes: forming a via extending through the substrate, in which the via is in contact with the first conductive structure; and forming a third electrode plate under the substrate, in which the third electrode plate is in contact with the via.

In summary, the trench capacitor and the stacked capacitor are electrically connected in parallel, and thus the decoupling capacitor collectively formed by the trench capacitor and the stacked capacitor has high capacitance. Moreover, the decoupling capacitor occupies low volume since the trench capacitor and the stacked capacitor are mutually aligned.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 1 is a flowchart of a method for fabricating a semiconductor structure in accordance with some embodiments of the present disclosure.

DETAILED DESCRIPTION

Figure 2:
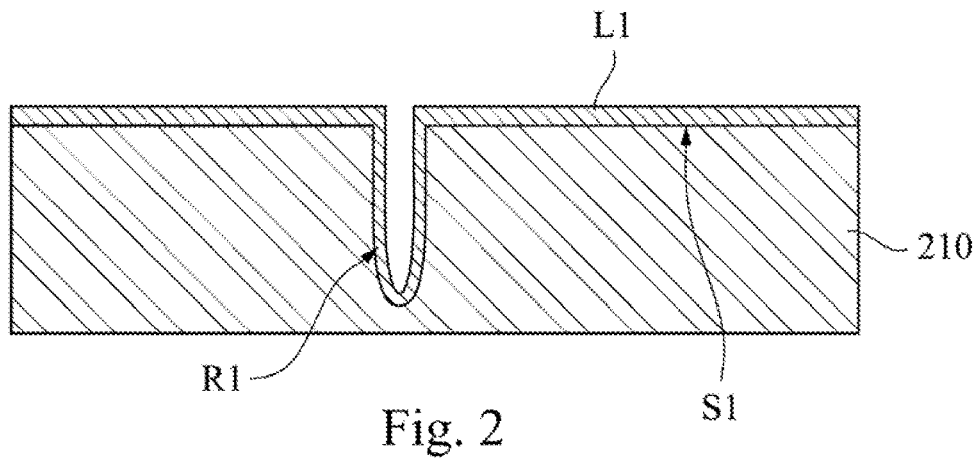
FIGS. 2-9 are cross-sectional views of intermediate stages of a method for fabricating a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 for fabricating a semiconductor structure in accordance with some embodiments of the present disclosure. The method 100 for fabricating a semiconductor structure begins with Step 101, in which a trench capacitor is formed in a substrate, and the trench capacitor has a first conductive structure and a first dielectric structure in contact with the first conductive structure. The method 100 continues with Step 103, in which a stacked capacitor which has a second conductive structure and a second dielectric structure in contact with the second conductive structure is formed, and the stacked capacitor is at least partially aligned with the trench capacitor in an axis vertical to a top surface of the substrate. The first and second conductive structures are electrically connected. The method 100 continues with Step 105, in which a first electrode plate which is electrically connected to the first and second dielectric structures is formed. The method 100 also includes Step 107, in which a second electrode plate electrically connected to the first and second conductive structures is formed, such that the trench capacitor and the stacked capacitor are electrically connected in parallel between the first and second electrode plates. Some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 3:
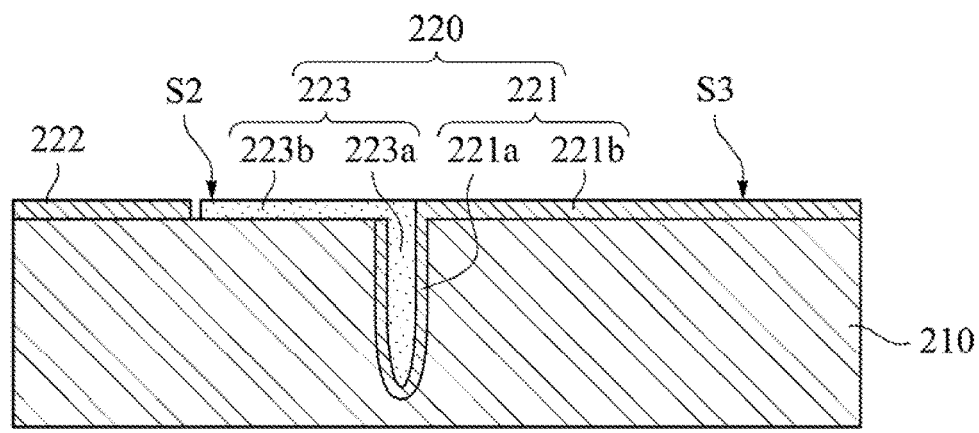

FIGS. 2-9 are cross-sectional views of intermediate stages of the method 100 for fabricating a semiconductor structure 200 in accordance with some embodiments of the present disclosure. FIG. 2 through FIG. 3 diagrammatically illustrate the Step 101 of forming a trench capacitor in a substrate. Referring to FIG. 2 and FIG. 3, a first recess R1 is formed in the substrate 210, and then a first conductive layer L1 is formed over the first recess R1 and a top surface S1 of the substrate 210. Thereafter, the first conductive layer L1 is partially removed, such that a first conductive structure 221 and a third conductive structure 222 separated with the first conductive structure 221 are formed. Next, the first dielectric structure 223 is formed over the first conductive structure 221, and the first dielectric structure 223 is spaced apart with the third conductive structure 222.

Specifically, the substrate 210 can be composed of any construction containing semiconductive material, including, but not limited to, bulk semiconductive materials such as a semiconductive wafer (either alone or in assemblies comprising other materials), and semiconductive material regions (either alone or in assemblies comprising other materials). The first conductive structure 221 and the first dielectric structure 223 can be formed by using a deposition process such as, for example, chemical vapor deposition (CVD), plasma enhanced chemical vapor deposition CVD (PECVD), physical vapor deposition (PVD), or other suitable deposition processes. Moreover, the first conductive layer L1 can be removed by an etching process such as an anisotropic etching process. The present disclosure is not limited in this respect.

In some embodiments of the present disclosure, the first conductive structure 221 has a first portion 221a surrounding a first portion 223a of the first dielectric structure 223 in the substrate 210, and the first portion 221a is cup-shaped. The first portion 221a of the first conductive structure 221 and the first portion 223a of the first dielectric structure 223 are located in the substrate 210, and thus the trench capacitor 220 occupies a small amount of space. Moreover, the first dielectric structure 223 has a top surface S2 level with a top surface S3 of the first conductive structure 221. The first conductive structure 221 has a second portion 221*b* extending above the substrate 210, and the first dielectric structure 223 has a second portion 223*b* extending above and in contact with the substrate 210.

Figure 4:
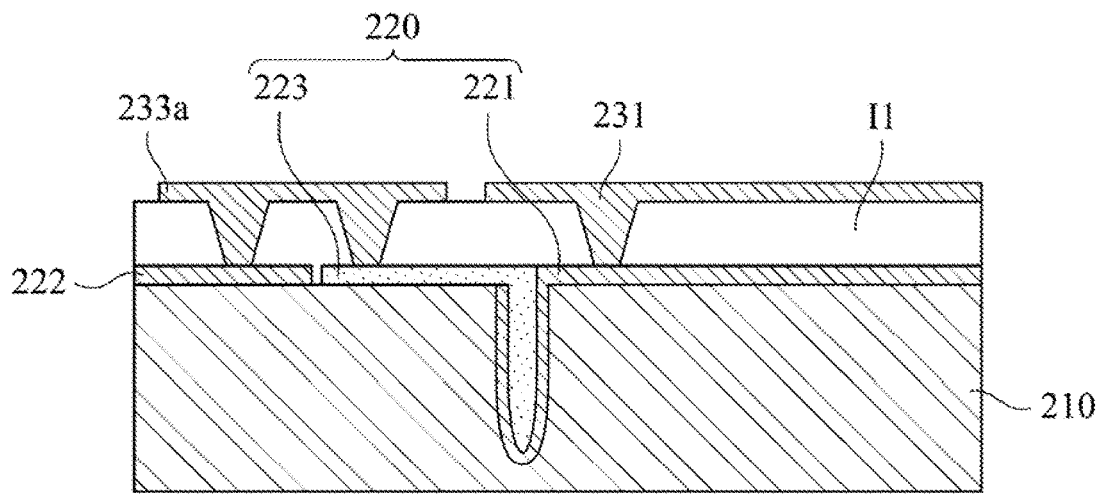

FIG. 4 through FIG. 7 diagrammatically illustrate the Step 103 of forming a stacked capacitor 240 which has a second conductive structure 241 and a second dielectric structure 243 in contact with the second conductive structure 241. Referring to FIG. 4, a first inter-metal dielectric layer 261 is formed on the substrate 210 and the trench capacitor 220. Thereafter, a first metal structure 231 extending through the first inter-metal dielectric layer 11 is formed by suitable deposition processes or electro-plating processes, in which the first metal structures 231 is in contact with the first conductive structure 221. In addition, a first portion 233*a* of a second metal structure 133 (referring to FIG. 9) is formed, and the first portion 133*a* has two metal pillars extending through the first inter-metal dielectric layer 11 and respectively in contact with the third conductive structure 222 and the first dielectric structure 223.

Figure 5:
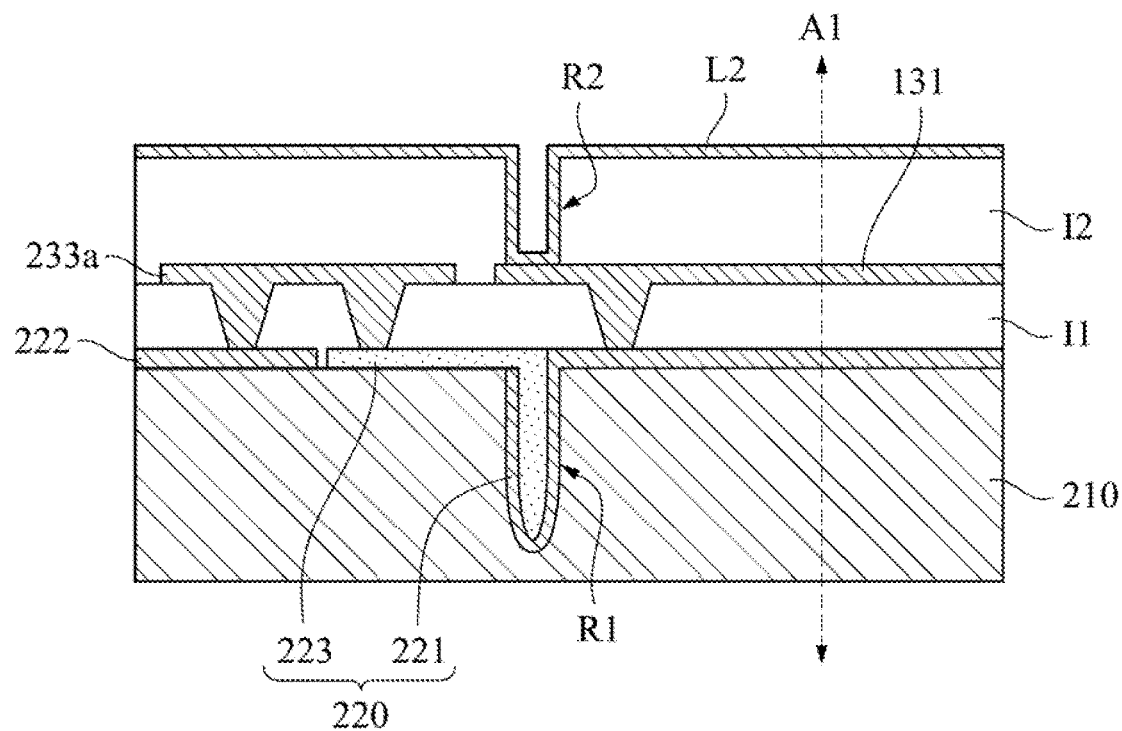
Figure 6:
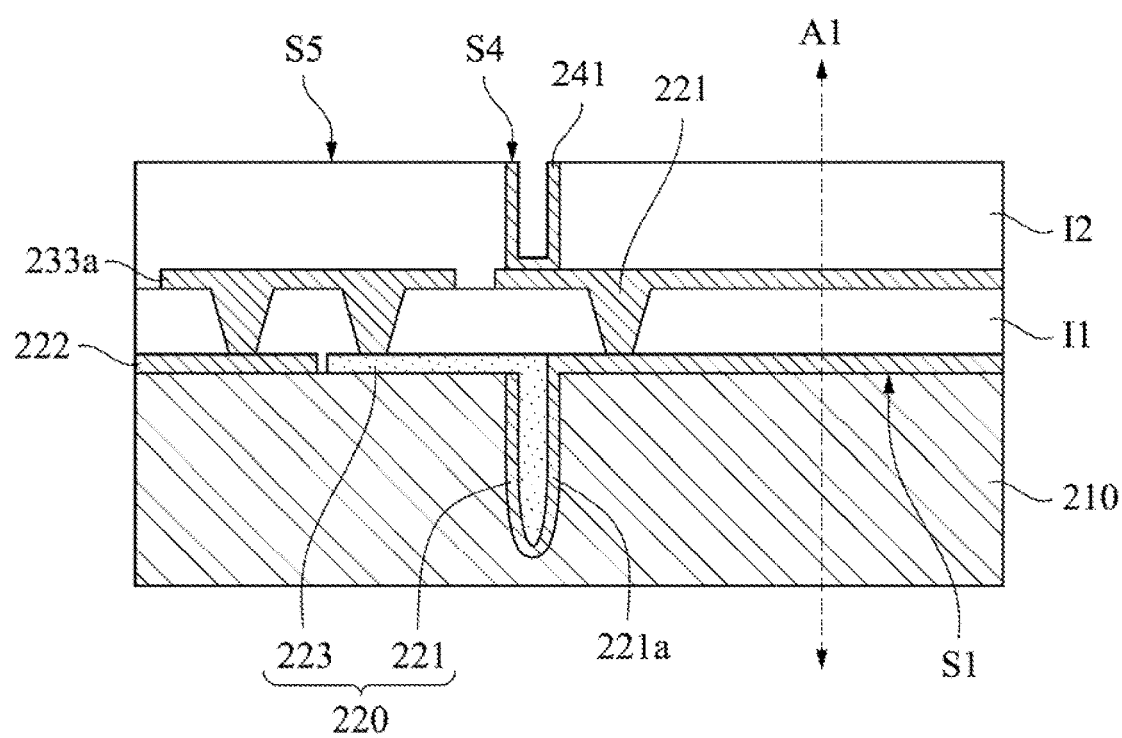

Referring to FIG. 5 and FIG. 6, a second inter-metal dielectric layer 12 is formed over the first inter-metal dielectric layer 11 and the first metal structure 131. A second recess R2 which is aligned with the first recess R1 according to an axis A1 vertical to a top surface S1 of the substrate 210 is formed in the second inter-metal dielectric layer 12, and the second recess R2 exposes the first metal structure 131. Thereafter, a second conductive layer L2 is formed over the second recess R2 and the second inter-metal dielectric layer 263 by any suitable deposition process, and then a chemical-mechanical planarization (CPM) process is performed to the second conductive layer L2 to partially remove the second conductive layer L2 on the second inter-metal dielectric layer 12, such that the cup-shaped second conductive structure 241 is formed in the second recess R2. Moreover, the second conductive structure 241 is in contact with the first conductive structure 221. Specifically, the second conductive structure 241 has a top surface S4 level with a top surface S5 of the second inter-metal dielectric layer 12. The present disclosure is not limited in this respect. The first portion of the first conductive structure 221 is align with the second conductive structure 241 along with the axis A1 vertical to the top surface S1 of the substrate.

Figure 7:
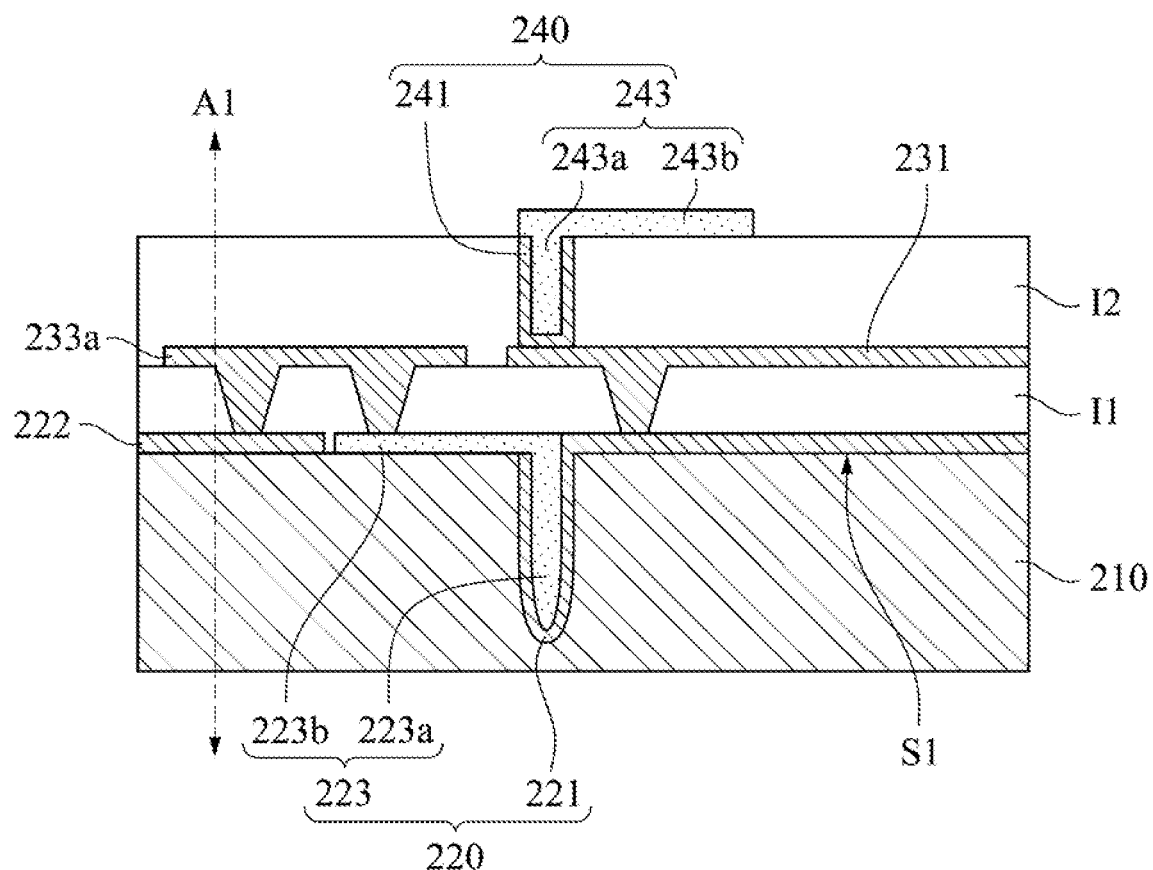

Referring to FIG. 7, a second dielectric structure 243 is formed over the second conductive structure 241 by any suitable deposition process and any suitable etching process. Specifically, the second dielectric structure 243 has a first portion 243*a* surrounded by the cup-shaped second conductive structure 241 in the second inter-metal dielectric layer 12, and the second dielectric structure 243 has a second portion 243*b* extending above and in contact with the second inter-metal dielectric layer 12. The first portion 243*a* of the second dielectric structure 243 is aligned with the first portion 223*a* of the first dielectric structure 223 along with the axis A1 vertical to the top surface S1 of the substrate 210.

Figure 8:
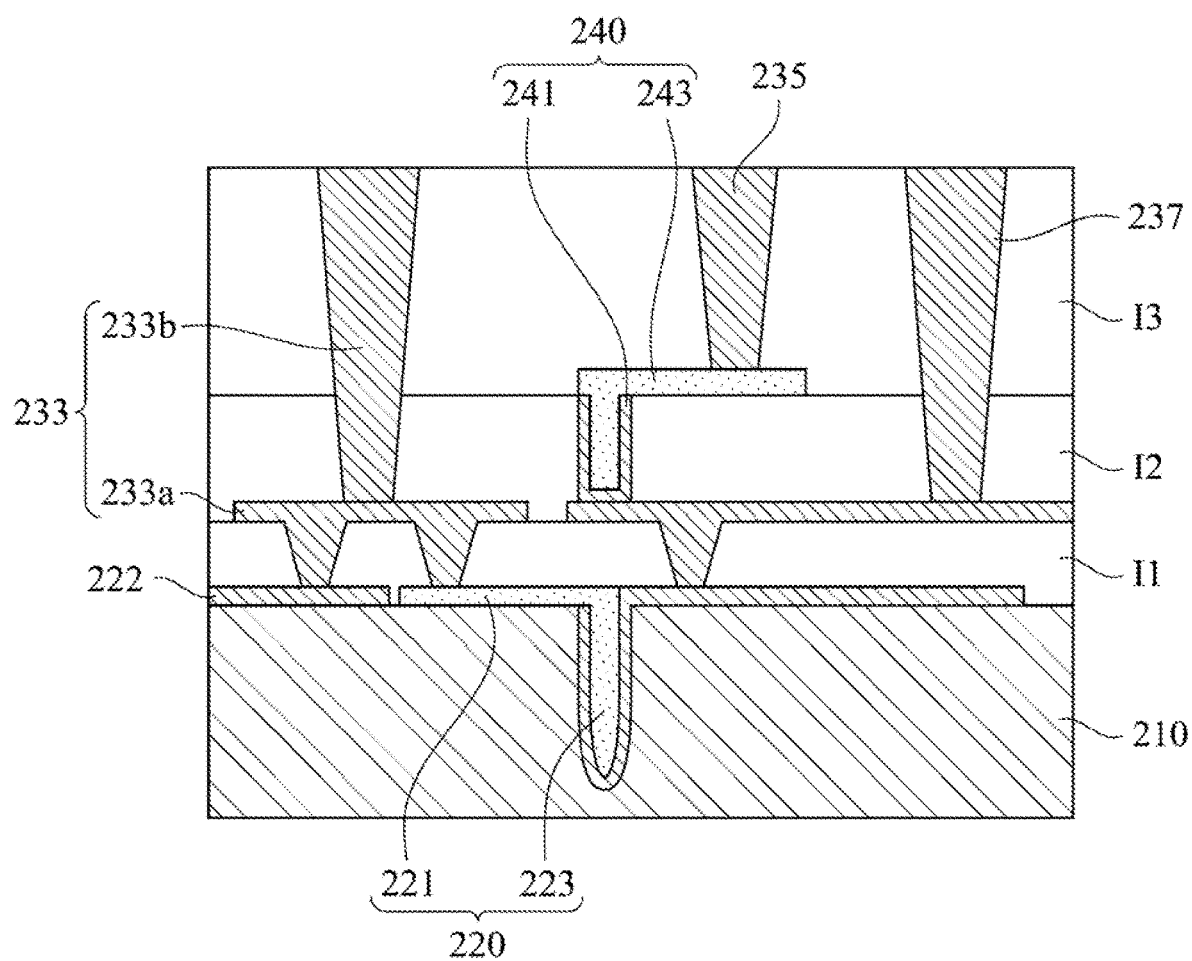
Figure 9:
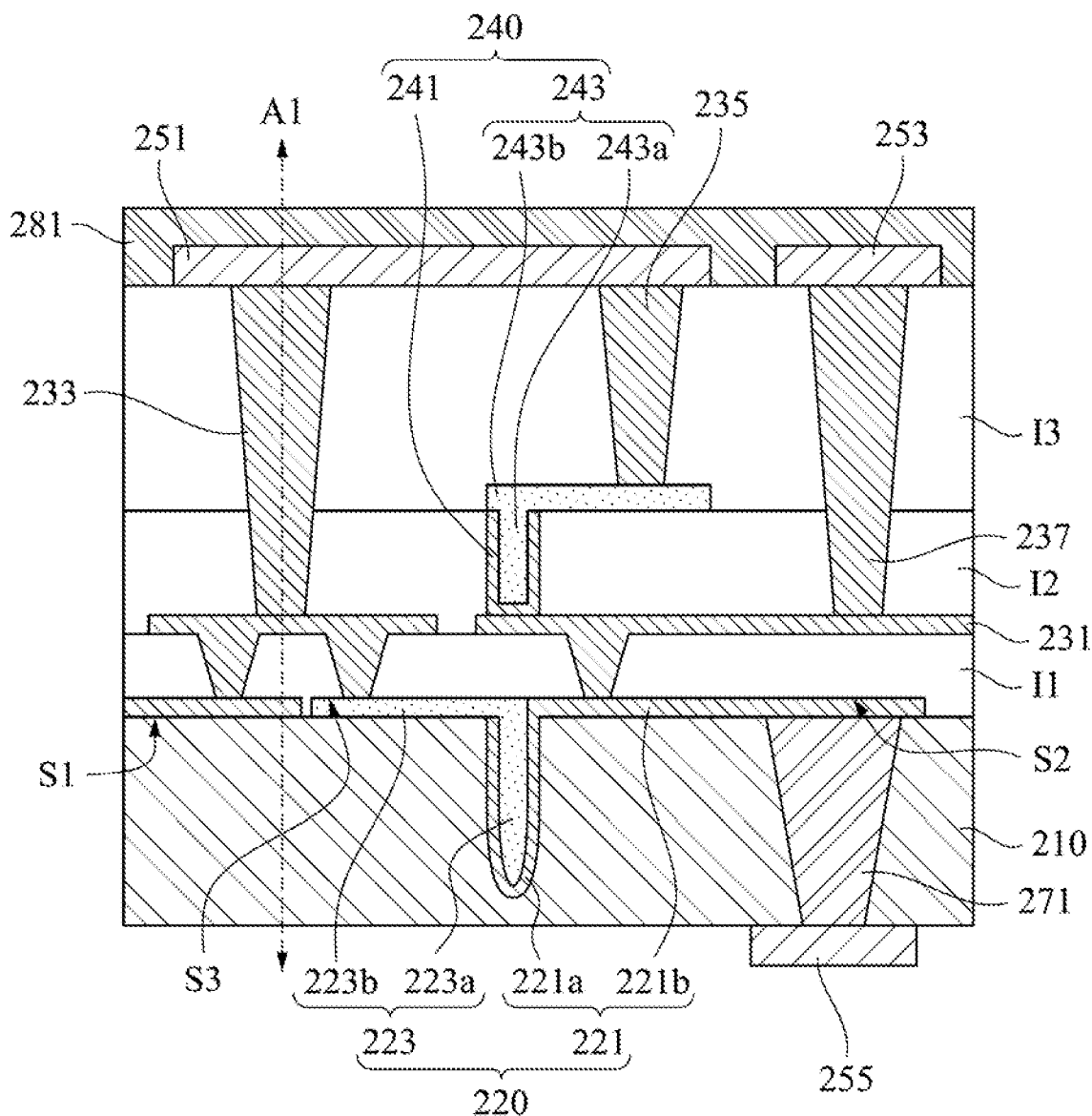

FIG. 8 through FIG. 9 diagrammatically illustrate Step 105 of forming the first electrode plate 251 and Step 107 of forming the second electrode plate 153, and the first electrode plate 251 and the second electrode plate 253 can be formed by any suitable deposition process and any etching process. The present disclosure is not limited in this respect. The first electrode plate 251 is electrically connected to the first and second dielectric structures 223, 243, and the second electrode plate 153 is electrically connected to the first and second conductive structures 221, 241, such that the trench capacitor 220 and the stacked capacitor 240 are electrically connected in parallel between the electrode plates 251, 253. After Steps 105, 107 are performed, a decoupling capacitor 200, also known as a semiconductor structure, is formed, and the decoupling capacitor 200 includes the trench capacitor 220 and the stacked capacitor 240 electrically connected in parallel.

In some embodiments of the present disclosure, Step 105 includes forming a third inter-metal dielectric layer 13 on the second inter-metal dielectric layer 12. Specifically, the inter-metal dielectric layers 11, 12, 13 are located between the first electrode plate 251 and the substrate 210. Next, a second portion 233*b* of the second metal structure 233 extending through the second and third inter-metal dielectric layers 12, 13 are formed on the first portion 233*a*, and the second portion 233*b* of the second metal structure 233 is in contact with the first electrode plate 251. Therefore, the first electrode plate 251 is electrically connected to the first dielectric structure 223. Moreover, a third metal structure 235 extending through the third inter-metal dielectric layer 13 is formed on the second portion 243*b* of the second dielectric structure 243, and the third metal structure 235 is in contact with the first electrode plate 251 and the second dielectric structure 243.

In some embodiments of the present disclosure, Step 107 includes forming a third inter-metal dielectric layer 13 on the second inter-metal dielectric layer 12. Specifically, the inter-metal dielectric layers 11, 12, 13 are located between the second electrode plate 253 and the substrate 210. Step 107 further includes forming a forth metal structure 237 extending through the second and third inter-metal dielectric layers 12, 13, in which the forth metal structure 237 is in contact with the second electrode plate 253 and the first metal structure 231. Therefore, the second electrode plate 253 is electrically connected to the first and second conductive structures 221, 241. Moreover, a protective layer 281 can be formed over the electrode plates 251, 253, and the protective layer 281 can contains silicon dioxide ($SiO_2$). The present disclosure is not limited in this respect.

In some embodiments of the present disclosure, the method 100 further includes: forming a via 271 extending through the substrate 210, in which the via 271 is in contact with the second portion 221*b* of the first conductive structure 221; and forming a third electrode plate 255 under the substrate 210, in which the third electrode plate 255 is in contact with the via 271. The via 271 can be formed by any suitable deposition process and any suitable etching process. In addition, a CMP process can be performed to the substrate 210 to decrease a thickness thereof, and thus the thickness of the substrate 210 is equal to or smaller than 6 um for the formation of the via 271. The third electrode plate 255 can be electrically connected to a power end or a grounding end. The present disclosure is not limited in this respect.

Referring to FIG. 9, another aspect of the present disclosure related to the decoupling capacitor 200 including the trench capacitor 220, the stacked capacitor 240, the first electrode plate 251, and the second electrode plate 253. The trench capacitor 220 is located in the substrate 210, in which the trench capacitor 220 has the first conductive structure 221 and the first dielectric structure 223 which is in contact with the first conductive structure 221. The stacked capacitor 240 has a second conductive structure 241 and a second dielectric structure 243 which is in contact with the second conductive structure 241, and the stacked capacitor 240 is at least partially aligned with the trench capacitor 220 in the axis A1 vertical to the top surface S1 of the substrate 210, and the first and second conductive structures 221, 241 are electrically connected. The first electrode plate 251 is electrically connected to the first and second dielectric structures 223, 243. The second electrode plate 253 is electrically connected to the first and second conductive structures 221, 241, such that the trench capacitor 220 and the stacked capacitor 240 are electrically connected in parallel between the electrode plates 251, 253.

In some embodiments of the present disclosure, the first conductive structure 221 has the top surface S2 level with the top surface S3 of the first dielectric structure 223. The first dielectric structure 223 has the first portion 223a surrounded by the first portion 221a of the first conductive structure 221 in the substrate 210, and the first dielectric structure 223 has the second portion 223b extending above the substrate 210.

In some embodiments of the present disclosure, the first inter-metal dielectric layer 11 is located between the trench capacitor 220 and the stacked capacitor 240. The first metal structure 231 extends through the first inter-mental dielectric layer 11, and the first inter-mental dielectric layer 11 is in contact with the first and second conductive structures 221, 241 at opposite sides.

In some embodiments of the present disclosure, the second inter-mental dielectric layer 12 is located on the first dielectric layer 11, and the second inter-mental dielectric layer 12 surrounds the second conductive structure 241 therein. The second conductive structure 241 is cup-shaped, and the second conductive structure 241 is aligned with the first conductive structure 221. Moreover, the second conductive structure 241 surrounds the first portion 243a of the second dielectric structure 243 in the second inter-mental dielectric layer 12. The second portion 243b of the second dielectric structure 243 extends above and in contact with the second inter-metal dielectric layer 12. Moreover, the second portion 243b of the second dielectric structure 243 and the second portion 223b of the first dielectric structure 223 extend towards two opposite directions respectively.

The third inter-metal dielectric layer 13 is located on the stacked capacitor 240 and on the second inter-metal dielectric layer 12. The first electrode plate 251 and the second electrode plate 253 are located on the third inter-metal dielectric layer 13. The second metal structure 233 extends through the inter-metal dielectric layers 11, 12, 13, and the second metal structure 233 is in contact with the first electrode plate 251 and the second portion 233b of the first dielectric structure 223. On the other hand, the third metal structure 235 such as a metal via extending through the third inter-metal dielectric layer 13 is formed over the second dielectric structure 243, and thus the third metal structure 235 is in contact with the first electrode plate 251 and the second dielectric structure 243. Therefore, the first electrode plate 251 is electrically connected to the first and second dielectric structures 223, 243.

The forth metal structure 237 such as a metal via extending through the second and third inter-metal dielectric layers 12, 13 is in contact with the second electrode plate 253 and the first metal structure 231. Therefore, the second electrode plate 253 is electrically connected to the first and second conductive structures 221, 241, and thus the trench capacitor 220 and the stacked capacitor 240 are electrically connected in parallel between the electrode plates 251, 253. Moreover, the protective layer 281 is formed over the third inter-metal dielectric layer 13, and the protective layer 281 covers the electrode plates 251, 253. The present disclosure is not limited in this respect.

In some embodiments of the present disclosure, the first and second dielectric structures 223, 243 include a high dielectric constant (high-k) material, which may include $TiO_2$, $Ta_2O_5$, $Y_2O_3$, $La_2O_5$, $HfO_2$, and other materials. Generally, the electrode plates 251, 253 can include conductive materials such as metals, certain metal nitrides, and silicided metal nitrides. The electrode plates 251, 253 may include Pt, AlCu, TiN, Au, Ti, Ta, TaN, W, WN, and Cu. The present disclosure is not limited in this respect.

In some embodiments of the present disclosure, the decoupling capacitor 200 further includes the via 271 and the third electrode plate 255. The via 271 extends through the substrate 210, in which the via 271 is in contact with the first metal structure 231. The third electrode plate 255 is under the substrate 210, and the third electrode plate 255 is in contact with the via 271. The second electrode plate 253 is aligned with the third electrode plate 255 along with the axis A1, and the via 271 is aligned with the forth metal structure 237 along the axis A1. The substrate 210 has a thickness equal to or smaller than 6 um in order to form the via 271 therein. The third electrode plate 255 can be electrically connected to a power end or a grounding end, and the third electrode plate 255 can include the same materials of the electrode plates 251, 253. The present disclosure is not limited in this respect.

Figure 10:
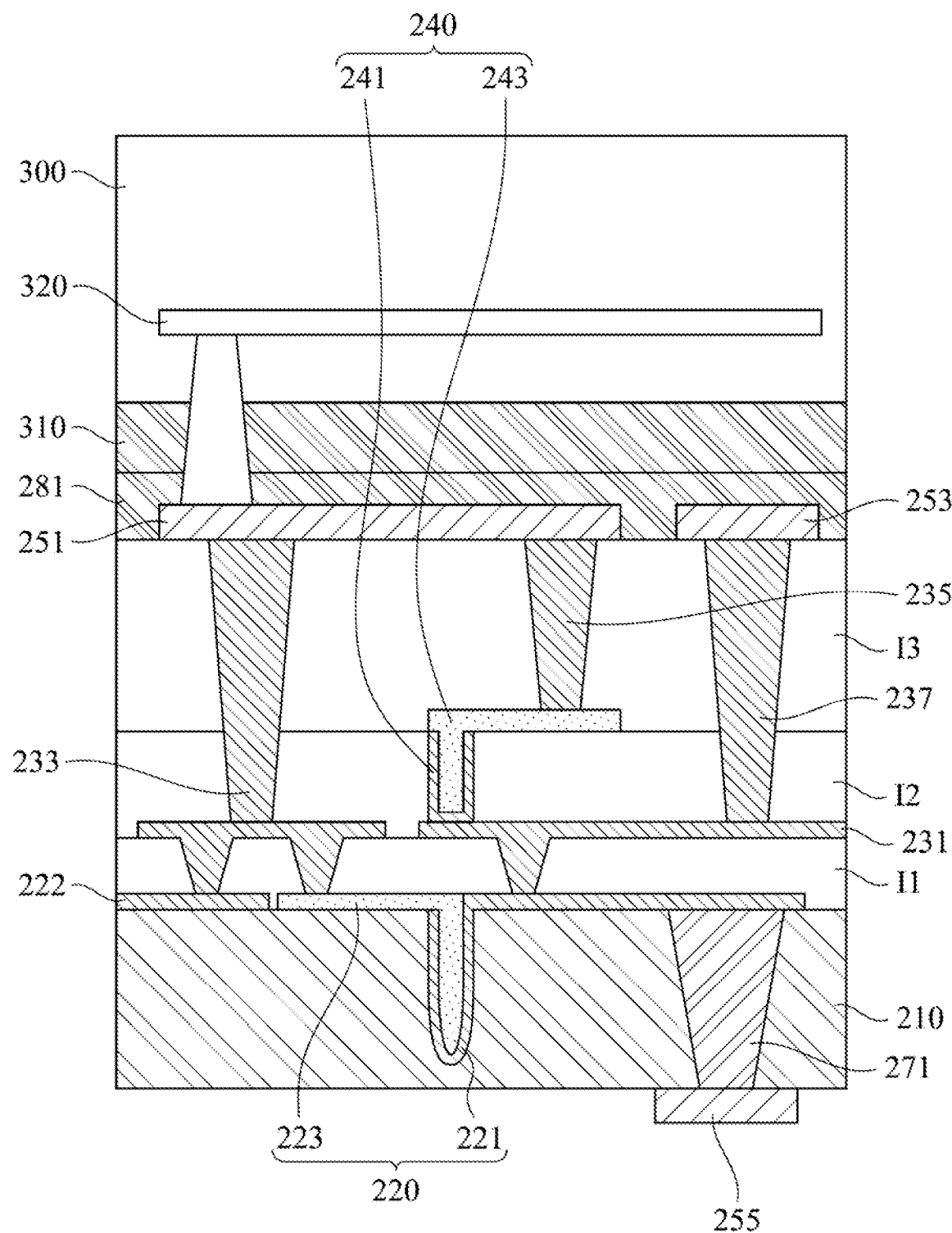
FIG. 10 is cross-sectional view of the semiconductor structure in FIG. 9 connected to a device wafer in accordance with some embodiments of the present disclosure.

Reference is made to FIG. 10. In some embodiments of the present disclosure, a wafer device 300 which has a protective surface 310 is laid on the decoupling capacitor 200. Moreover, the protective surface 310 is connected to the protective layer 281 by a fusion bonding process. The wafer device 300 further has a signal line 320 electrically connected to the first electrode plate 251. The present disclosure is not limited in this respect.

In summary, the trench capacitor and the stacked capacitor are electrically connected in parallel, and thus the decoupling capacitor collectively formed by the trench capacitor and the stacked capacitor has high capacitance. Moreover, the decoupling capacitor occupies low volume since the trench capacitor and the stacked capacitor are mutually aligned.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for fabricating a semiconductor structure, comprising:
    forming a trench capacitor in a substrate, wherein the trench capacitor comprises a first conductive structure and a first dielectric structure in contact with the first conductive structure;
    forming a stacked capacitor having a second conductive structure and a second dielectric structure in contact with the second conductive structure, wherein the stacked capacitor is at least partially aligned with the trench capacitor in an axis vertical to a top surface of the substrate, the first and second conductive structures are electrically connected;
    forming a first electrode plate electrically connected to the first and second dielectric structures; and
    forming a second electrode plate electrically connected to the first and second conductive structures, such that the trench capacitor and the stacked capacitor are electrically connected in parallel between the first and second electrode plates.

2. The method of claim 1, wherein the first conductive structure has a portion surrounding a portion of the first dielectric structure in the substrate.

3. The method of claim 1, wherein the first dielectric structure has a top surface level with a top surface of the first conductive structure.

4. The method of claim 1, wherein the first dielectric structure has a first portion aligned with a first portion of the second dielectric structure along with the axis, and a second portion of the first dielectric structure and a second portion of the second dielectric structure extend towards two opposite directions respectively.

5. The method of claim 4, wherein the second portion of the first dielectric structure extends above the substrate.

6. The method of claim 1, wherein the forming the trench capacitor in the substrate comprising:
   forming a first recess in the substrate;
   forming a first conductive layer over the first recess and the substrate; and
   partially removing the first conductive layer, such that the first conductive structure is formed; and
   forming the first dielectric structure over the first conductive structure.

7. The method of claim 6, wherein the forming the stacked capacitor comprises:
   forming a first metal structure extending through a first inter-metal dielectric layer on the trench capacitor, wherein the first conductive structure is in contact with the first metal structure;
   forming a second inter-metal dielectric layer on the first inter-metal dielectric layer;
   forming a second recess aligned with the first recess in the second inter-metal dielectric layer, and the second recess exposes a portion of the first metal structure;
   forming the second conductive structure over the second recess, wherein the second conductive structure is in contact with the first metal structure; and
   forming the second dielectric structure over the second conductive structure.

8. The method of claim 7, wherein the second conductive structure has a top surface level with a top surface of the second inter-metal dielectric layer.

9. The method of claim 7, wherein forming the second electrode plate comprises:
   forming an inter-metal dielectric layer between the second electrode plate and the substrate; and
   forming a forth metal structure in the inter-metal dielectric layer, wherein the forth metal structure is in contact with the second electrode plate and the first metal structure.

10. The method of claim 1, wherein the second conductive structure is cup-shaped.

11. The method of claim 1, wherein the forming the first electrode plate comprises:
   forming an inter-metal dielectric layer between the first electrode plate and the substrate; and
   forming a second metal structure and a third metal structure in the inter-metal dielectric layer, wherein the second metal structure is in contact with the first electrode plate and the second dielectric structure, the third metal structure is in contact with the first electrode plate and the first dielectric structure.

12. The method of claim 1, further comprising:
   forming a via extending through the substrate, wherein the via is in contact with the first conductive structure; and
   forming a third electrode plate under the substrate, wherein the third electrode plate is in contact with the via.

13. The method of claim 12, wherein the first conductive structure has a portion covering the top surface of the substrate and the via is in contact with the portion of the first conductive structure.

14. The method of claim 12, wherein the second electrode plate is aligned with the third electrode plate along with the axis.

15. The method of claim 1, wherein the second conductive structure surrounds a portion of the second dielectric structure.

* * * * *